(12) United States Patent
Heinrich

(10) Patent No.: US 10,375,797 B2
(45) Date of Patent: Aug. 6, 2019

(54) LIGHTING DEVICE AND METHOD FOR OPERATING THE LIGHTING DEVICE

(71) Applicant: HELLA KGaA Hueck & Co., Lippstadt (DE)

(72) Inventor: Jürgen Heinrich, Kirchzarten (DE)

(73) Assignee: HELLA GMBH & CO. KGAA, Lippstadt (DE)

( * ) Notice: Subject to any disclaimer, the term of this patent is extended or adjusted under 35 U.S.C. 154(b) by 338 days.

(21) Appl. No.: 14/154,435

(22) Filed: Jan. 14, 2014

(65) Prior Publication Data

US 2014/0197757 A1     Jul. 17, 2014

(30) Foreign Application Priority Data

Jan. 15, 2013   (DE) ................. 10 2013 200 512

(51) Int. Cl.
*H05B 33/08* (2006.01)
*H05B 37/02* (2006.01)
*H03K 17/96* (2006.01)

(52) U.S. Cl.
CPC ..... *H05B 37/0227* (2013.01); *H05B 33/0863* (2013.01); *H05B 37/0245* (2013.01); *H03K 17/962* (2013.01)

(58) Field of Classification Search
None
See application file for complete search history.

(56) References Cited

U.S. PATENT DOCUMENTS

| | | | | |
|---|---|---|---|---|
| 5,532,557 | A | * | 7/1996 | Saidian ............... F21V 19/006 307/116 |
| 7,221,271 | B2 | * | 5/2007 | Reime ............... H05B 33/0803 340/541 |
| 7,342,485 | B2 | * | 3/2008 | Joehl ................. B60J 7/057 296/223 |
| 8,207,682 | B2 | * | 6/2012 | Lan ................... H05B 33/0863 315/293 |

(Continued)

FOREIGN PATENT DOCUMENTS

| | | |
|---|---|---|
| DE | 196 53 682 A1 | 6/1998 |
| DE | 102 511 33 B3 | 7/2004 |

(Continued)

OTHER PUBLICATIONS

STMicroelectronics NV, AN2967 Application note: Implementing a driven shield on STM8T and STM8TS capacitive sensors, May 2009.*

(Continued)

*Primary Examiner* — Alexander H Taningco
*Assistant Examiner* — Renan Luque
(74) *Attorney, Agent, or Firm* — Paul D. Strain, Esq.; Strain & Strain PLLC

(57) ABSTRACT

The invention relates to a lighting device having a first number of light-emitting elements and having a second number of control elements, operating contactlessly, for controlling the light-emitting elements such as especially for switching the light-emitting elements on or off and/or for controlling their brightness, the second number being less than or equal to the first number, the light-emitting elements being controlled contactlessly by a movement of at least one hand of a user over two or more control elements. The invention also relates to a relevant method.

5 Claims, 8 Drawing Sheets

(56) References Cited

U.S. PATENT DOCUMENTS

| | | | | |
|---|---|---|---|---|
| 8,217,763 B2* | 7/2012 | Elferich | ............ | H05B 37/0227 340/10.5 |
| 8,344,659 B2* | 1/2013 | Shimomura | ....... | H05B 37/0245 315/169.3 |
| 8,502,547 B2* | 8/2013 | Philipp | ................... | G06F 3/044 324/658 |
| 8,624,845 B2* | 1/2014 | Grivna | ................... | G06F 3/041 345/104 |
| 8,884,552 B2* | 11/2014 | van Doorne | ....... | H05B 37/0209 315/291 |
| 2006/0044800 A1* | 3/2006 | Reime | ................ | H05B 33/0803 362/276 |
| 2007/0041169 A1* | 2/2007 | Konet | ................. | H03K 17/962 362/84 |
| 2007/0291010 A1* | 12/2007 | Altonen | ............... | H05B 39/085 345/173 |
| 2009/0231167 A1* | 9/2009 | Chen | ................... | H03K 17/962 341/22 |
| 2009/0262548 A1* | 10/2009 | Ando | ....................... | B60Q 3/82 362/544 |
| 2010/0031203 A1* | 2/2010 | Morris | ................ | G06F 3/04883 715/863 |
| 2012/0248992 A1* | 10/2012 | Jeon | ................... | H05B 37/0227 315/155 |
| 2013/0300316 A1* | 11/2013 | Engel-Hall | ............ | H05B 37/02 315/307 |
| 2014/0265934 A1* | 9/2014 | Ramey | ..................... | B60Q 3/54 315/307 |
| 2015/0062941 A1* | 3/2015 | Sura | ........................ | B60Q 3/82 362/488 |
| 2017/0117891 A1* | 4/2017 | Lohbihler | .............. | G08C 17/02 |

FOREIGN PATENT DOCUMENTS

DE   10 2005 005 411 A1   8/2006
WO   WO 2009/089092 A1   7/2009

OTHER PUBLICATIONS

Texas Instruments, PCB-Based Capacitive Touch Sensing With MSP430, Oct. 2007.*
German Search Report, Application No. DE 10 2013 200 512.1, dated Oct. 15, 2013, 5 pgs.

* cited by examiner

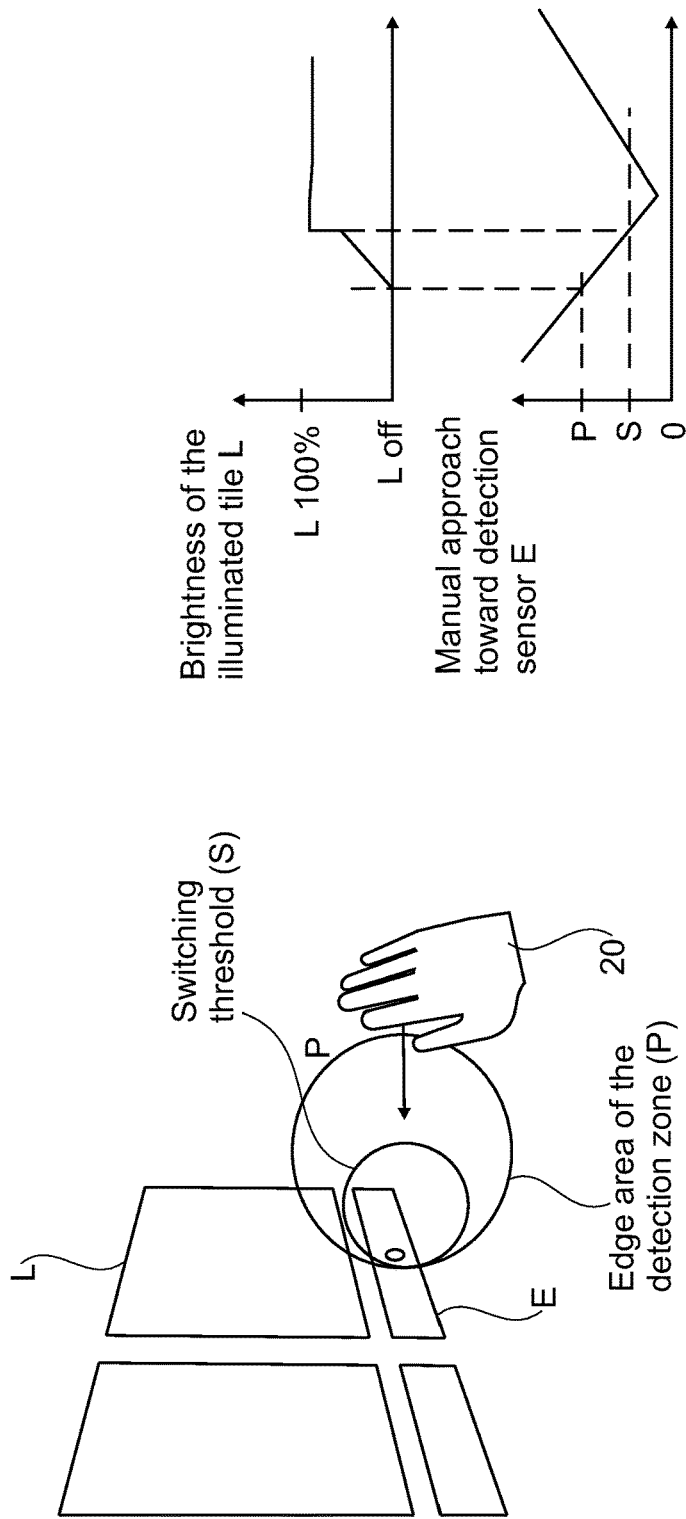

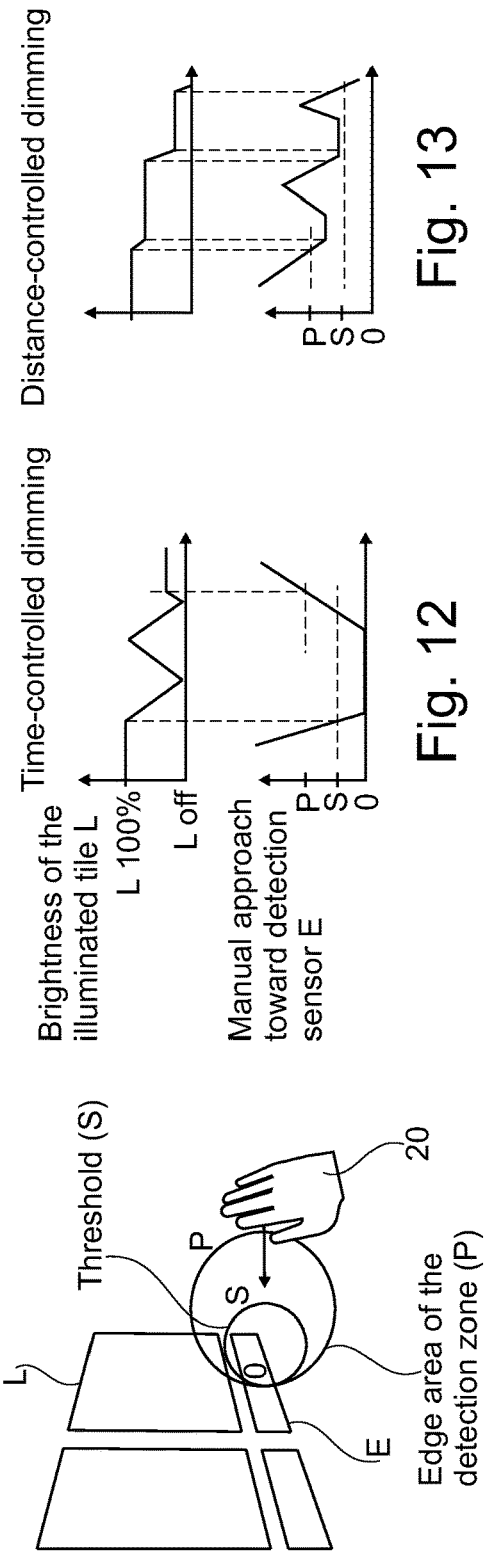

LIGHTING DEVICE AND METHOD FOR OPERATING THE LIGHTING DEVICE

CROSS-REFERENCE TO RELATED PATENT APPLICATIONS

This application is based upon and claims the benefit of priority from prior German Patent Application No. 10 2013 200 512.1, filed Jan. 15, 2013, the entire contents of which are incorporated herein by reference in their entirety.

TECHNICAL FIELD

The invention relates to a lighting device and a method for operating a lighting device.

PRIOR ART

In the prior art, lighting devices are known which are applied in the vehicle passenger compartment. In this context, light-emitting elements are used which are in each case switched on by means of mechanical switches and locally generate a light for an operator or passenger. However, the construction of these lighting devices is not very narrow in the vertical direction.

Lighting devices have also become known which comprise a proximity sensor as is disclosed in DE 10 2005 005 411 A1. This printed document discloses an control element which is illuminated when approached with a hand. However, it is not possible to design a lighting device by this means, especially for the rear area or the front area of the vehicle passenger compartment.

PRESENTATION OF THE INVENTION, OBJECT, SOLUTION, ADVANTAGES

It is the object of the present invention, therefore, to create a lighting device which is constructed in a simple and especially flat manner and, nevertheless, is individually controllable. It is also the object of the present invention to create a method for operating a lighting device which can be executed in a simple manner and, nevertheless, allows individual controllability.

The object of the present invention is achieved with regard to the lighting device by means of the features according to claim 1.

An illustrative embodiment of the invention relates to a lighting device having a first number of light-emitting elements and having a second number of control elements, operating contactlessly, for controlling the light-emitting elements such as especially for switching the light-emitting elements on or off and/or for controlling the brightness of the light-emitting elements, the second number being less than or equal to the first number, the light-emitting elements being controlled contactlessly by a movement of at least one hand of a user, especially over two or more control elements. This allows a flat type of construction in connection with which good and individual controllability is also achieved.

In this context, the lighting device is especially a lighting device for the passenger compartment of a motor vehicle, such as especially a front or rear area lighting device.

In this context, it is especially advantageous if the light-emitting elements are two-dimensional light-emitting elements such as especially two-dimensional light-emitting diodes (LEDs) or two-dimensional organic light-emitting diodes (OLEDs) or LED- or OLED-illuminated two-dimensional optical waveguides. By this means, good illumination can be achieved with a type of construction which, at the same time, is flat. Alternatively, other light-emitting elements can also be used.

It is also advantageous if the light-emitting elements are arranged in a first geometric arrangement with respect to one another, such as arranged especially in at least one row next to one another. In this context, the light-emitting elements are arranged next to one another in such a manner that they form a row or a plurality of parallel rows. It is also possible to choose other geometric arrangements for the arrangement of the light-emitting elements and/or of the control elements such as oval, arcuate or circular arrangements.

It is also appropriate if the control elements operating contactlessly are capacitive sensor elements, each capacitive sensor element having at least one detection antenna. By the approach of, for example, a hand, these can already generate a signal which can be used for the control. Thus, a simple and advantageous design can be achieved which also allows a flat type of construction.

It is also appropriate if the detection antennas of at least two sensor elements are arranged in a second geometric arrangement with respect to one another, such as especially in one row next to one another. This results in good controllability with a multiplicity of sensor elements.

It is also appropriate if the control elements are allocated to the light-emitting elements. The allocation means in this context that there is a spatial and/or functional allocation.

It is also appropriate if the first geometric arrangement essentially corresponds to the second geometric arrangement. Thus, in the case of one row as geometric arrangement, the one row of light-emitting elements can be arranged in parallel with the row of sensor elements. The same can apply to a different arrangement.

It is particularly advantageous if the first geometric arrangement is at least one first row and the second geometric arrangement is at least one second row, the at least one first row being arranged in parallel with the at least one second row.

It is particularly advantageous if the light-emitting elements and the control elements are in signal communication with a control unit and the control unit receives signals from the control elements and performs a request detection in a detection unit. The request detection reads in the sensor signal outputs. By this means, the intended control undertaking is received as sensor signals from the movements of, for example, a hand, by means of a detection.

It is also appropriate if the detection unit, after the request detection, generates at least one signal which is processed by an interpretation unit and generates at least one drive signal which is implemented in a drive unit for driving the light-emitting elements. The interpretation unit identifies the intended control by means of the signals which are generated by the sensors and evaluated by the request unit.

The interpretation unit interprets the relevant signal input and performs, for example, a combination interpretation or a combination sequence interpretation so that the intended purpose is identified and an operating error is prevented by operating-error prevention.

The light-emitting elements can be controlled by a digital on or off, a PWM control for selectively brightening or darkening the light-emitting elements also being controllable. By this means, a slow transition of the brightness can be achieved.

It is also appropriate if the detection unit, the interpretation unit and the drive unit are part of the control unit and are implemented as electronic interconnection and/or program control. Thus, a central control unit having the functionality which can be produced in a simple and inexpensive manner can be achieved.

In this context, it is also appropriate if the light-emitting elements and/or the control elements are accommodated in a housing. This can then be installable in the vehicle, for example as a constructional unit.

In this context, it is appropriate if the light-emitting elements and/or the control elements are accommodated under a cover. They are thus arranged so as to be visually appealing and protected against misuse.

It is also appropriate if the control elements are covered by a cover strip and/or an operating web.

The object of the present invention with regard to the method is achieved by means of the features according to claim 15.

An illustrative embodiment of the invention relates to a method for operating a lighting device especially according to at least one of the preceding claims, having a first number of light-emitting elements and having a second number of control elements operating contactlessly for controlling the light-emitting elements such as, especially, for switching the light-emitting elements on or off and/or for controlling their brightness, the control elements being allocated to the light-emitting elements, the light-emitting elements being controlled contactlessly by a movement of at least one hand of a user, especially over two or more control elements.

In this context, it is advantageous if with an approach of a hand toward a control element or toward a first light-emitting element having an associated control element, the first light-emitting element brightens up or lights up if it was previously not lit or not lit maximally.

In this context, it is appropriate if when the hand moves from a first control element or from a first light-emitting element having an associated control element to an adjacent second control element or to a second light-emitting element having an associated control element, the first light-emitting element darkens and/or is extinguished and the second light-emitting element brightens and/or lights up. By means of a lateral movement of the hand, a transition from the illumination of the first light-emitting element to the second light-emitting element can thus be achieved in which, during the transition of the hand, the adjacent light-emitting element is also driven to light up whilst the light-emitting element from which the hand is removed is then darkened or switched off, respectively.

It is particularly advantageous if when a hand moves away from a control element or from a light-emitting element with an associated control element, the light-emitting element remains in its current status. By this means, the status of lighting can be changed from one light-emitting element to another light-emitting element, the lighting device remaining in its current lighting situation at the end of the movement and with the removal of the actuating hand.

It is also appropriate if when a hand approaches a control element or a first light-emitting element having an associated control element, the first light-emitting element darkens or is extinguished if it has previously not been lit or not lit maximally.

Furthermore, it is appropriate if an approach of a hand is an approach or touching of a cover or of an operating web by the hand for the purpose of intuitive operability.

In this context, it is also appropriate if moving of a hand from a first light-emitting element to an adjacent second light-emitting element is a lateral moving of the hand along a cover or an operating web.

It is advantageous if a removal of a hand is a removal of the hand from a cover or an operating web.

In this context, it is particularly advantageous if with a fast movement of the hand from a first light-emitting element over an adjacent second light-emitting element to a further adjacent third light-emitting element, the first light-emitting element darkens or is extinguished and the second light-emitting element brightens or lights up and subsequently the second light-emitting element darkens or is extinguished and the third light-emitting element brightens or lights up. As a result, the lighting-up of a light-emitting element is shifted virtually from one light-emitting element to a more distant light-emitting element in which, during the transition of the hand, the adjacent light-emitting element is also activated to light up while the light-emitting element, from which the hand is removed, is then darkened or switched off.

In this context, it is appropriate if, starting from the first light-emitting element in the direction of movement of the hand, N light-emitting elements are provided, the third light-emitting element also darkens or is extinguished and the subsequent light-emitting element brightens or lights up, this process being repeated until the (N−1)th light-emitting element darkens or is extinguished and the Nth light-emitting element brightens or lights up.

In this context, it is especially advantageous if fast moving is moving which does not exceed a predeterminable period of time. It is thus appropriate if the movement drops below a period of 0.5 seconds for a distance of about 10 to 20 cm.

It is also advantageous if the transition from one light-emitting element to the adjacent light-emitting element for brightening up or lighting up the respectively adjacent light-emitting element occurs with uniform or decreasing speed. That is to say that the time interval between the lighting-up of a light-emitting element to the lighting-up of the adjacent light-emitting element increases with increasing progress.

It is also advantageous if with a movement of two hands in opposite directions along the control elements or the light-emitting elements with associated control elements, the light-emitting elements are all switched on or off or increase or decrease in their brightness so that they brighten up or light up or darken or are extinguished. By this means, complete switching-on or -off can be achieved by means of an unambiguous gesture with both hands.

It is particularly appropriate if the movement of two hands in opposite directions is a movement of the hands toward each other or away from each other. Thus, one of the two movements can be used for switching on and the other one of the two movements can be used for switching off. As an alternative, one of the two movements can be used both for switching-on and switching-off depending on which state exists. If all light-emitting elements are switched off, this would thus result in switching-on. If at least one of the light-emitting elements were switched on, one would be able to achieve a switching-off with the gesture.

It is also appropriate if with a direction-changing movement of one hand in the opposite direction along control elements or light-emitting elements with associated control elements, the light-emitting elements are switched on or off or increase or decrease in their brightness so that they brighten up or light up or darken or are extinguished.

It is also appropriate if the direction-changing movement occurs at least during a predeterminable period of time such as, for example, at least for one second.

It is also appropriate if with an approach of the hand toward a control element or toward a first light-emitting element with an associated control element, the light-emitting element brightens up or lights up if the distance of the hand has already reached or dropped below a first threshold value for the distance but has not yet reached a second, smaller threshold value, the light-emitting element being lit maximally when the second threshold value is reached or undershot. By this means, easier finding of the light-emitting elements in the dark can be achieved.

It is advantageous if darkening or extinction of the light-emitting element takes place when the distance of the hand increases again after reaching or dropping below the first threshold value. By this means, it is achieved that the lighting of the light-emitting element is reduced again, that is to say darkened, when the hand is retracted again from a certain position of the hand which leads to the at least beginning lighting-up.

It is also appropriate if brightening or lighting-up of the light-emitting element takes place or is maintained when the distance of the hand increases again after reaching or dropping below the second threshold value. By this means, it is achieved that switching-on takes place when the second threshold value is undershot and this switching-on remains when the hand is retracted. It is only with a further illustrative approach that it is then possible to switch off again.

It is also appropriate if the brightness of the light-emitting means is driven in dependence on the distance of the hand between the first and second threshold values. If the hand is moved closer to the second threshold value, the light-emitting element is activated to be brighter than if the hand were to be moved less close to the second threshold value.

In this context, it may be advantageous if the brightness of the light-emitting means is driven linearly as a function of the distance of the hand between the first and second threshold values, the brightness being controlled to increase or decrease on approaching the second threshold value. Thus, the brightness can be controlled antiproportionally with the distance.

In this context, it is appropriate if the brightness of the light-emitting means is driven in dependence on the period of time of the position of the hand in the distance between the first and second threshold values. If the hand remains for longer in that position, the light-emitting element is driven to be brighter.

It is also appropriate if the brightness of the light-emitting means is driven to become brighter or darker or cyclically brighter and thereafter darker again with an increasing period of time. This can then also be controlled to be repetitive so that a continuous brightening and darkening again is controlled as a cyclic procedure.

It is also appropriate if the above procedure or parts thereof can also be performed several times. Thus, various light-emitting means can be controllable successively by the movement of the hand.

It is also appropriate if the brightening or lighting-up and/or the darkening or extinction of light-emitting elements occurs incrementally or continuously or abruptly or digitally and completely.

Advantageous developments of the present invention are described in the subclaims and in the subsequent description of the figures.

BRIEF DESCRIPTION OF THE DRAWINGS

In the text which follows, the invention will be explained in detail with reference to an illustrative embodiment, referring to a drawing, in which:

FIG. 9 shows a representation of the approach of a hand toward a sensor element;

FIG. 10 shows a diagram for explanation of the control of the brightness in dependence on the position of the hand according to FIG. 9;

FIG. 11 shows a representation of the approach of a hand toward a sensor element;

FIG. 12 shows a diagram for explanation of the control of the brightness in dependence on the position of the hand according to FIG. 11; and FIG. 13 shows a diagram for explanation of the control of the brightness in dependence on the position of the hand according to FIG. 11.

PREFERRED EMBODIMENT OF THE INVENTION

Figure 1:
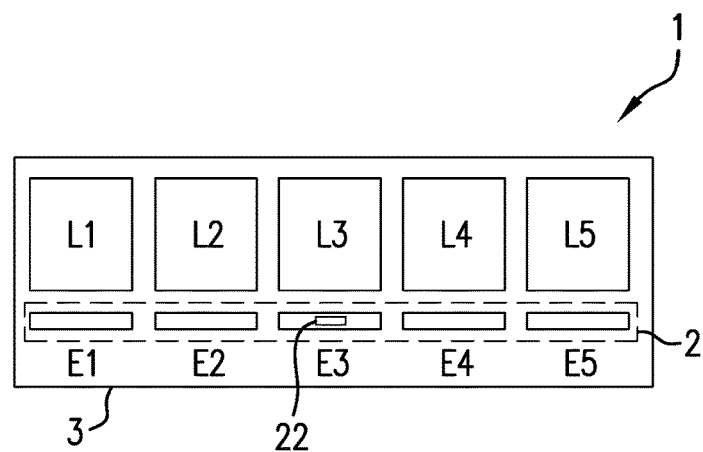
FIG. 1 shows an arrangement of light-emitting elements and sensor elements.

FIG. 1 shows a lighting device 1 having a first number N1 of light-emitting elements L1, L2, L3, L4, L5, wherein also a second number N2 of control elements E1, E2, E3, E4, E5 advantageously operating contactlessly is provided.

The control elements E1 to E5 are used for switching the light-emitting elements L1 to L5 on or off and/or controlling their brightness. In this context, a light-emitting element can be driven continuously by PWM modulation in its brightness or it can be switched on or off completely.

The light-emitting elements L1 to L5 are represented as two-dimensional, for example rectangular or square light-emitting elements which are arranged next to one another in one row. The control elements E1 to E5 are represented as narrow rectangular elements which are also arranged next to one another flush in one row with one another. The light-emitting elements L1 to L5 are in this case arranged in one row, the row of light-emitting elements being arranged in parallel with one row of the control elements E1 to E5.

To each light-emitting element L1 to L5, one control element E1 to E5 is allocated which is arranged adjacently to the light-emitting element L1 to L5. The control elements E1 to E5 are preferably covered under a cover strip 2 with or without an operating web, the light-emitting elements L1 to L5 also being accommodated under a transparent cover strip or a transparent cover. In this context, the light-emitting elements L1 to L5 and the control elements E1 to E5 are preferably accommodated in a housing 3.

The light-emitting elements L1 to L5 are preferably two-dimensional light-emitting elements L1 to L5 such as, for example, two-dimensional light-emitting diodes (LEDs) or two-dimensional organic light-emitting diodes (OLEDs) or LED- or OLED-illuminated two-dimensional optical waveguides. Due to the design of the light-emitting elements L1 to L5 as two-dimensional light-emitting diodes or as two-dimensional organic light-emitting diodes, a particularly flat design of the lighting device 1 can be selected.

The control elements E1 to E5 are control elements E1 to E5 operating contactlessly such as, for example, capacitive sensor elements which respond to the approach of, for example, a hand of an operator and wherein, due to the selective approach of the hand of an operator, the light-emitting elements can be driven selectively.

In this context, the approach of a hand means, for example, also the approach of a finger or another body part wherein auxiliary elements can also definitely be used as an alternative. In this respect, movement of a hand can also be understood to be the movement of a finger or of a corresponding auxiliary element.

The capacitive sensor element E1 to E5 has at least one detection antenna 22 which detects the approach of a hand. In the text which follows, the arrangement of the sensor elements is equated with the arrangement of the detection antennas of the sensor element, which does not require any further explanation.

Figure 2:
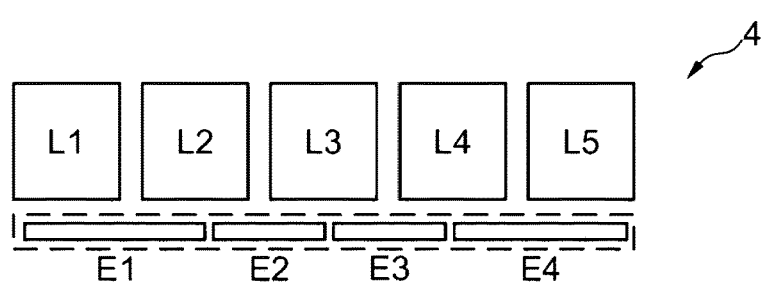
FIG. 2 shows a further arrangement of light-emitting elements and sensor elements.

FIG. 2 shows a further illustrative embodiment of a lighting device 4, five light-emitting elements L1 to L5 being provided in the illustrative embodiment of FIG. 2 but only four control elements E1 to E4 being provided. In this context, the lateral extent of the control elements E1 and E4 is greater than the lateral extent of the light-emitting elements L1 and L5 resulting in an offset arrangement of the control elements E1 to E4 with respect to the light-emitting elements L1 to L5.

The arrangement of the control elements E1 to E5 and of the light-emitting elements L1 to L5 in FIG. 1 results in nine operating positions. Thus, for example, only the control element E1 may be operated or in overlap the control elements E1 and E2, only the control element E2, in overlap the control elements E2 and E3, only the control element E3, in overlap the control elements E3 and E4, only the control element E4, in overlap the control elements E4 and E5 and only the control element E5. From reading-in the operating positions as a function of time, a control requirement of the operator can be analyzed correspondingly.

In the illustrative embodiment of FIG. 2, five light-emitting elements L1 to L5 are arranged opposite four control elements E1 to E4. The light-emitting element L1 is switched, for example, by activation of the control element E1 and the light-emitting element L5 is driven by an actuation of the control element E4. The light-emitting element L2 is driven by an actuation of the control elements E1 and E2, the light-emitting element L3 is driven by an actuation of the control elements E2 and E3 and the light-emitting element L4 is driven by an actuation of the control elements E3 and E4. The arrangement of the four control elements E1 to E4 results in seven operating positions, namely operating positions E1, E2, E3 and E4 and operating positions E1 and E2, E2 and E3 and E3 and E4. By means of the detection of the various operating configurations, the control requirement of the operator can then be analyzed.

Figure 3:
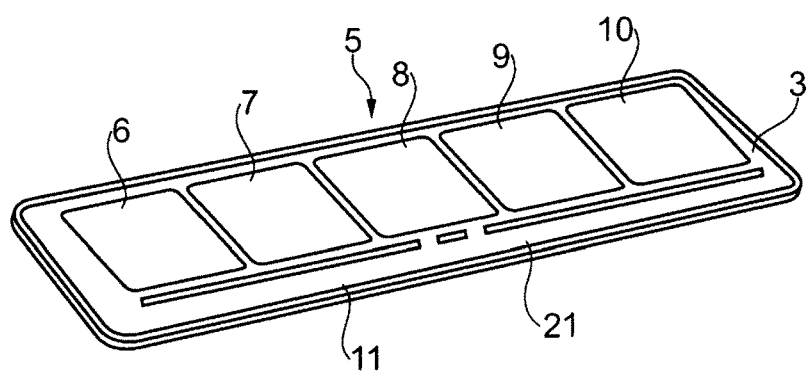
FIG. 3 shows a further arrangement of light-emitting elements with sensor elements arranged underneath an operating web.

FIG. 3 shows a lighting device 5, for example for a rear area of a motor vehicle having five light-emitting elements 6, 7, 8, 9, 10 which are arranged in one row next to one another. In front of the light-emitting elements 6 to 10, a cover strip 11 is provided which covers the control elements lying underneath. If a hand is moved toward the cover strip 11 or moved laterally along the cover strip, the control elements lying underneath detect the approach and the movement of the hand relative to the control elements. The cover strip 11 differs from the control elements so that the control elements are protected by the cover strip 11.

Figure 4:
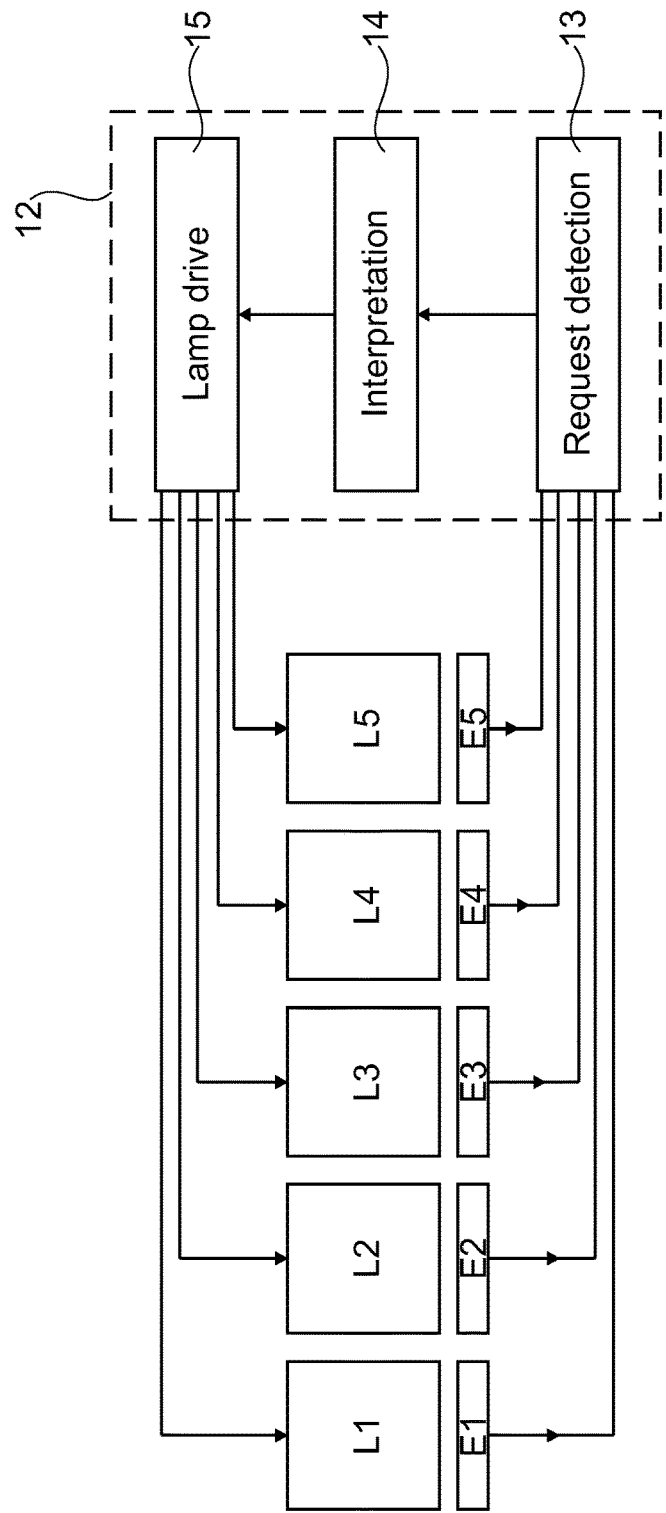
FIG. 4 shows an interconnection of the light-emitting elements and of the sensor elements.

FIG. 4 shows that both the light-emitting elements L1 to L5 and the control elements E1 to E5 are in signal communication with a control unit 12. In this context, the control unit 12 receives signals from the control elements E1 to E5 and processes them in order to generate drive commands for the light-emitting elements L1 to L5 in order to be able to control the brightness of the light-emitting elements L1 to L5.

Within the control unit, a unit 13 for request detection, such as a detection unit, and a unit 14 for interpretation, such as an interpretation unit, and a unit 15 for lamp drive, such as a drive unit, are provided.

The detection unit 13 performs a request detection so that the sensor signal outputs forward their signals to the detection unit 13 in order to determine from these a request profile for the intended drive by the operator.

In this context, the sensor signals can be represented digitally as operated or unoperated or they can be output alternatively as distance-dependent approach values.

The detection unit 13 transfers the evaluated data to the interpretation unit 14 which performs a combination interpretation, a combination sequence interpretation and an operating-error prevention in order to be able to evaluate the interpretation of the gestures.

If on the basis of the interpretation an intention to operate by the operator is detected, at least one control signal to the drive unit for driving the light-emitting elements is thus generated and forwarded so that the light-emitting elements L1 to L5 are correspondingly driven in order to drive a selective brightness of the light-emitting elements L1 to L5.

The detection unit 13, the interpretation unit 14 and the drive unit 15 are in this case preferably implemented in a control unit 12 such as, for example, in a microcontroller as electronic interconnection and/or as program control.

The operation of the lighting device 1 with a gestural operator detection is explained by means of an internal motor vehicle lamp. As an alternative, another lamp can also be shown, however.

The internal motor vehicle lamp is designed with an arrangement of rectangular or square light-emitting elements, the evaluation of the gestural operator detection being explained in the text which follows.

Instead of the square light-emitting elements which can be arranged and used, for example, as light-emitting diodes or organic light-emitting diodes, other light-emitting elements can also be provided. The light-emitting elements are arranged in one row in the illustrative embodiments, wherein it may be advantageous if the lighting device is dimensioned in such a manner that the lamp is arranged in the motor vehicle, for example in the vehicle rear area, dimensioned in such a manner that the right-hand light-emitting means is arranged above the right-hand passenger in the vehicle roof lining and the left-hand light-emitting means is arranged above the left-hand passenger in the vehicle roof lining. The operation is effected subsequently underneath the lamp along the lamp. In this context, the operation can also take place along an operating web 21 provided which extends over essentially the entire lighting device in the lateral direction. In this context, the strip is arranged on the side of the light-emitting elements facing the passengers for better accessibility and detectability so that the passenger of the vehicle, as operator, perceives the operating web as such and uses it as an orientation aid for the movement of the hand for operating the lighting device.

As an alternative to the linear arrangement of the light-emitting elements and control elements in each case in one row, another type of arrangement, for example circular or oval or in another geometric arrangement, can also be provided. The invention is not restricted to the linear arrangement of the elements in rows.

The operating web is advantageously only an optical design element which does not have any function for the actuation of the control elements but is only intended to stimulate the operator to move his hand along the operating web. The actual sensor elements are located behind the operating web and cannot be seen.

According to FIG. 3, it is advantageous if the operating web is integrated into the housing 3. In this context, it is advantageous if the operating web consists of electrically non-conductive material so that it does not disturb the capacitive sensor elements lying underneath.

As an alternative to the linear arrangement of the control elements in front of the row of light-emitting elements, another type of design and arrangement of the sensor elements can also be provided. In this context, it is also possible to dispense with the operating web, for example. Thus, for example, an edge or a frame can be designed to be rectangular or U-shaped in each case surrounding the light-emitting elements so that the arrangement is also facilitated by this means and the range of the sensors can be increased as a result.

FIGS. 5 to 8 show the mode of action of a gestural drive for the lighting device in diagrams.

Figure 5:
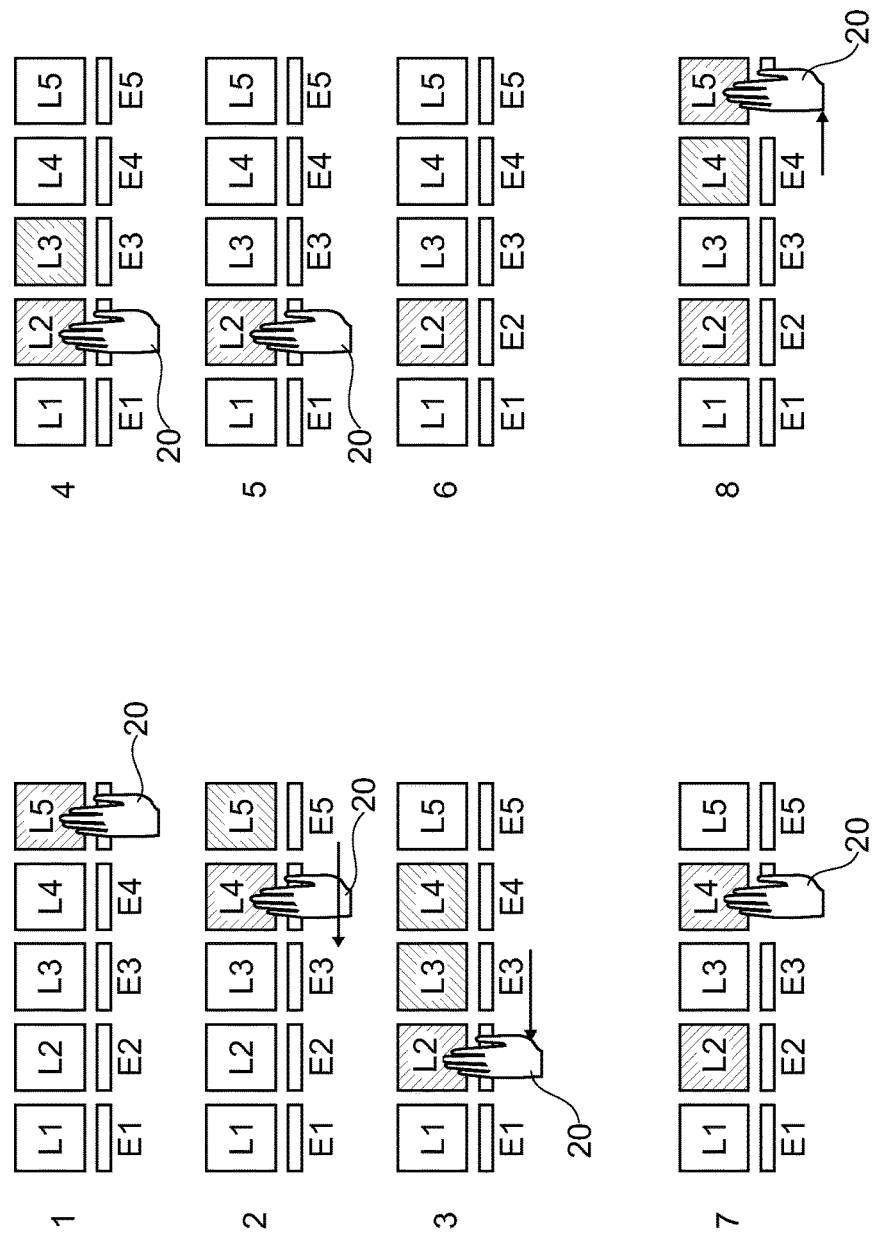
FIG. 5 shows a diagram for representation of an illustrative embodiment for carrying out the method.

In FIG. 5, it can be seen in the first part-figure that a hand 20 approaches the light-emitting element L5 and the control element E5 so that the light-emitting element L5 is driven to light up whereas the light-emitting elements L1 to L4 are still dark. If then, according to the second part-figure of FIG. 5, the hand 20 is shifted to the left in the lateral direction, it is moved over the light-emitting element L4 with the control element E4 so that the light-emitting element L4 is driven to light up whereas the light-emitting element L5 is driven in such a manner that it darkens because the hand 20 is no longer operating the control element E5. The light-emitting elements L1 to L3 are still dark and are not lit. Subsequently, the hand 20 is moved on from the light-emitting element L4 to the light-emitting element L2 in the third part-figure of FIG. 5, which has the effect that the light-emitting elements L3, L4 and L5 become dark again offset in time and only the light-emitting element L2 is then lit, the light-emitting element L2 being lit maximally in the situation of the third part-figure whereas the light-emitting elements L3 and L4 have a lesser luminance and the light-emitting element L5 is already switched off. Subsequently, the hand dwells on the light-emitting element L2, according to the fourth part-figure of FIG. 5, so that the light-emitting element L4 is already darkened, whereas the light-emitting element L3 darkens further. In the fifth part-figure of FIG. 5, the hand 20 still dwells on the light-emitting element L2 so that now only this light-emitting element L2 is lit whilst the light-emitting elements L1 and L3 to L5 are darkened. If the hand 20 is removed, only the light-emitting element L2 is switched on according to the sixth part-figure as the light-emitting elements L1 and L3 to L5 are darkened.

FIG. 5 explains a process whereby after a hand 20 approaches a light-emitting element L1 to L5 or a light-emitting element L1 to L5 with a control element E1 to E5 and by lateral displacement of the hand 20, the luminous light-emitting element L1 is transferred, as it were, so that the state of illumination is displaced laterally from an initial light-emitting element L5 to a further adjacent light-emitting element L2. In the first three part-figures of FIG. 5, the illumination status of the light-emitting element L5 is transferred to the light-emitting element L2. Subsequently, the hand 20 remains on the light-emitting element L2 so that the remaining light-emitting elements are darkened, only the light-emitting element L2 now being lit after removal of the hand 20.

This process can also be repeated, the hand approaching the light-emitting element L4 with the light-emitting element L2 being lit, see seventh part-figure of FIG. 5, and subsequently being displaced in the lateral direction toward the light-emitting element L5, see eighth part-figure of FIG. 5. This has the effect that the light-emitting element L2 and the light-emitting element L5 are lit whilst the light-emitting element L4 gradually darkens. After removal of the hand, only the light-emitting elements L2 and L5 are then lit.

Figure 6:
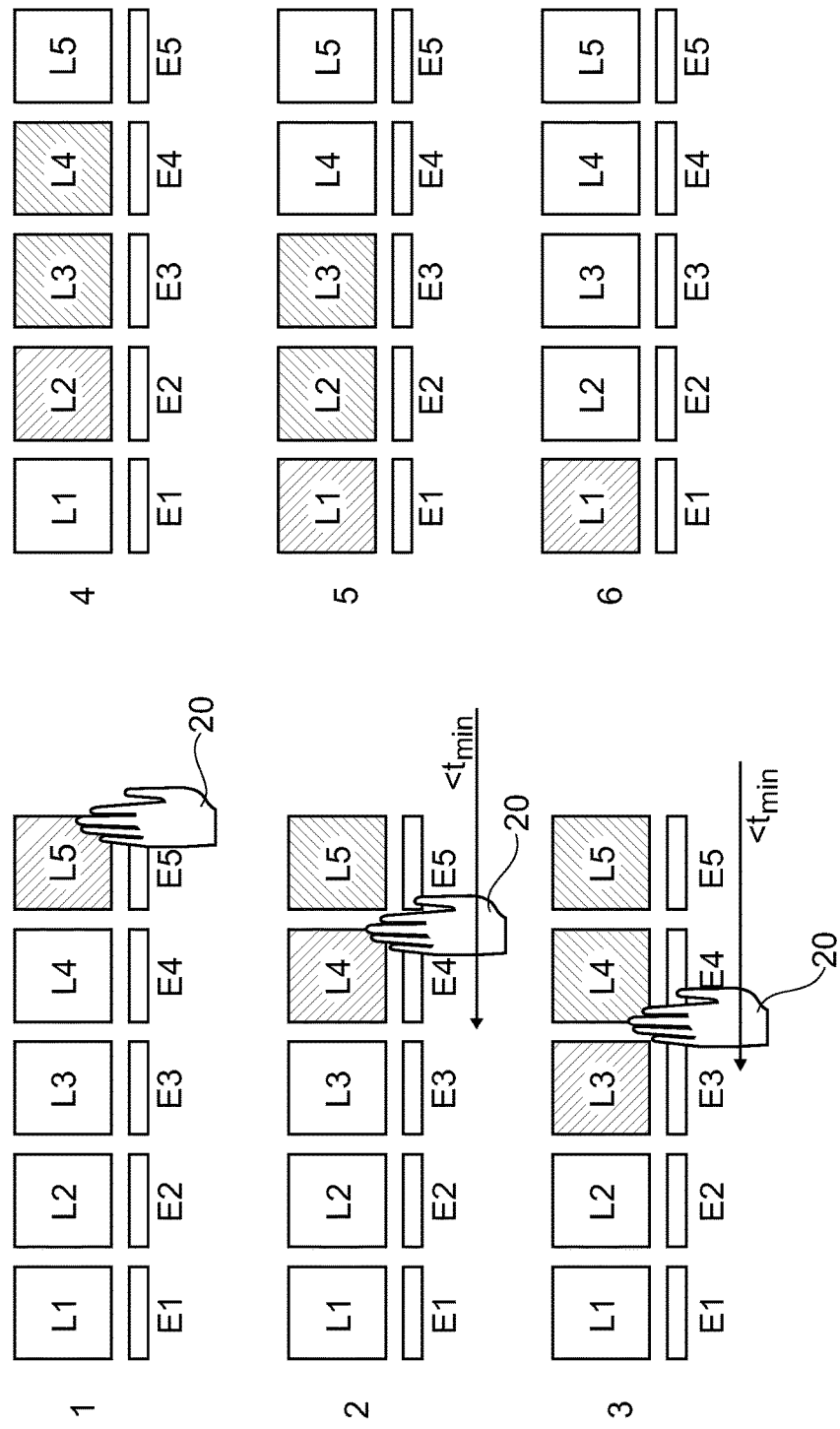
FIG. 6 shows a diagram for representation of an illustrative embodiment for carrying out the method.

FIG. 6 shows a diagram having six part-figures for the explanation of a further procedure according to the invention. A hand 20 approaches the light-emitting element L5. As a result, the light-emitting element L5 is driven to light up. In part-FIG. 2 and in part-FIG. 3, the hand 20 moves in a fast movement from a first light-emitting element L5 over an adjacent second light-emitting element L4 to a further adjacent third light-emitting element L3 so that subsequently the first light-emitting element darkens again or is extinguished and the second light-emitting element also initially brightens up, see second part-figure of FIG. 6, and subsequently the second light-emitting element L4 darkens again and is extinguished, the third light-emitting element brightening or lighting up.

If the duration of movement of the hand 20 is below a threshold value of a predeterminable period of time, the signal for brightening the light-emitting elements continues to run, wherein, starting from the first light-emitting element in the direction of movement of the hand, N light-emitting elements, in this case five light-emitting elements, are provided, wherein the third light-emitting element also darkens and the subsequent light-emitting element brightens, this process being continued and repeating until the (N−1)th light-emitting element darkens or is extinguished and the Nth light-emitting element brightens.

In the present case, the brightened light-emitting element thus runs through from right to left although only three light-emitting elements with their control elements have been operated by the hand 20. However, the control unit detects the gesticular scenario of the movement of the hand as a fast movement of the hand in one direction and detects that by means of the fast hand movement over three light-emitting elements with their control elements, a so-called pushing of the light is achieved. The so-called pushing function provides the option that a light is pushed over to the passenger sitting next to the driver without said passenger having to lean over to the associated light-emitting element or without having to reach the latter.

The control unit detects the time between the time of passing over or touching or activating the three control elements of the three light-emitting elements passed over. If this period of time is below a defined threshold value, the method step otherwise used according to the method according to FIG. 5 becomes a method according to FIG. 6 according to which the light of a light-emitting element is pushed, as it were, to the next one. The light is continued following the first three light-emitting elements without direct further activation of the control elements of the further light-emitting elements.

In special illustrative embodiments, the minimum number of light-emitting elements or control elements passed over of three can also be reduced or increased. Thus, there can also be an activation in the case of fast passing-over of only two or else of four or more elements. However, the design by means of at least three control elements passed over is advantageous since, with only two control elements, a misinterpretation cannot necessarily be avoided.

Figure 7:
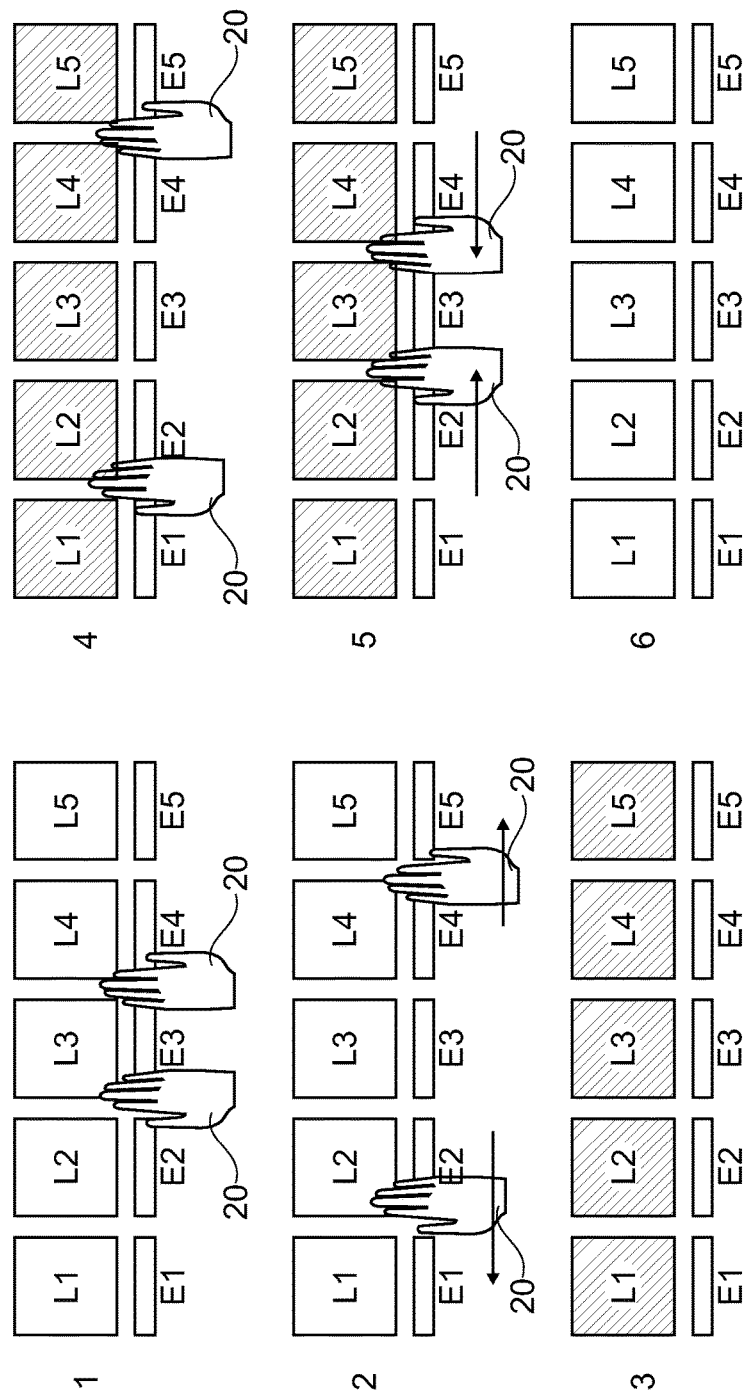
FIG. 7 shows a diagram for representation of an illustrative embodiment for carrying out the method.

FIG. 7 shows a further procedure in a further diagram, a first procedure being explained in part—FIGS. 1 to 3 and a second procedure being explained in part—FIGS. 4 to 6.

In this context, the movement of two hands 20 in opposite directions along the control elements E1 to E5 or the light-emitting elements L1 to L5 with associated control elements E1 to E5 is detected so that switching-on or -off of all light-emitting elements L1 to L5 is activated. The switching-off preferably only occurs here at the active light-emitting elements, that is to say at the light-emitting elements which are switched on. Switching-on preferably occurs here only at the inactive light-emitting elements, that is to say at the light-emitting elements which are switched off. As an alternative, only partially lit light-emitting elements can also be switched on completely so that they are lit maximally.

In the first part-figure of FIG. 7, two hands 20 are moved to the light-emitting elements and are subsequently moved from a central area in each case laterally and in opposite directions toward the outside. This is shown in the second part-figure of FIG. 7. Following this, all light-emitting elements L1 to L5 are switched on, see the third part-figure of FIG. 7.

In the fourth part-figure of FIG. 7, two hands 20 are moved to the light-emitting elements or the relevant control elements, respectively. In this process, the hands are slightly spaced apart so that they are moved to the light-emitting elements at the respective edge area of the row of light-emitting elements. Following this, the two hands are moved laterally toward each other, see the fifth part-figure of FIG. 7. Following this, all light-emitting elements are switched off, see the sixth part-figure of FIG. 7.

Figure 8:
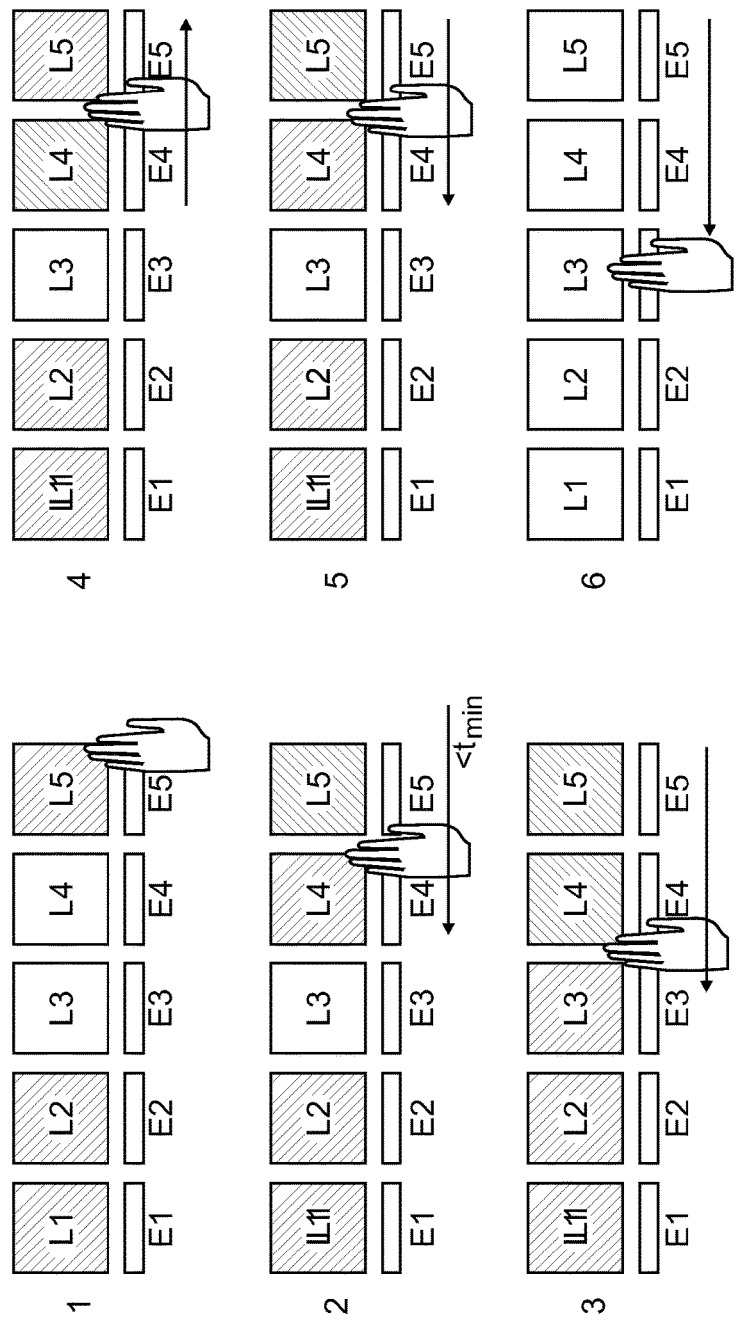
FIG. 8 shows a diagram for representation of an illustrative embodiment for carrying out the method.

In FIG. 8, a further procedure is explained in a diagram. In the first part-figure of FIG. 8, the two light-emitting elements L1 and L2 are lit, one hand 20 being moved to the light-emitting element L5. As a result, the light-emitting element L5 is lit. Following this, see second part-figure of FIG. 8, the hand moves in the lateral direction over the light-emitting element L4 to the light-emitting element L3 so that firstly the light-emitting element L4 and after that the light-emitting element L3 are lit, following which the light-emitting element L5 and the light-emitting element L4 are darkened and switched off again. Following this, the hand is moved again from light-emitting element L3 to light-emitting element L5, see part—FIG. 4, and following this, back from light-emitting element L5 to light-emitting element L3, see part—FIG. 5. The detection unit for detecting the gesticulation performs a detection of a wiping back and forth over the three light-emitting elements L5 to L3, which is considered to be a command for switching off all light-emitting elements, which takes place in part-FIG. 6.

FIG. 9 and FIG. 10 show the behavior with an approach of a hand 20 toward a control element E. As long as the hand 20 is further away from the control element E than the distance having the amount P, no switching-on of the light-emitting element L is performed. If the hand 20 is moved closer to the control element than an amount P, but the distance is still greater than S, the brightness of the light-emitting element L preferably increases linearly before the light-emitting element L is switched to maximum brightness when reaching the distance S. Between P and S, a nonlinear characteristic can also be activated for the lighting-up, such as a progressive characteristic.

In this context, FIG. 10 shows in the top diagram the brightness of the light-emitting element L and in the lower diagram the approach toward the detection sensor of the light-emitting element L, that is to say the control element, as a function of time.

FIGS. 11, 12 and 13 show a diagram for explaining a further procedure in the activation of the light-emitting elements on approach of the hand 20 toward a light-emitting element L or toward the control element E of the light-emitting element, respectively. A time-controlled dimming, that is to say increasing or reducing, of the brightness can take place. When the hand 20 approaches closer than the distance P but further away than the distance S, the control unit performs a time-controlled dimming according to which the brightness of the light-emitting element L is cyclically varied between 0% and 100%. If the hand is removed again so that the distance is greater than P, the brightness remains as it has been set last.

FIG. 13 shows a distance-controlled procedure according to which the brightness of the light is constant when moving the hand 10 by more than L so that the brightness is at 100% in a switched-on state. If subsequently the hand is moved up closer than P and farther than S, the brightness of the light-emitting element is reduced, the brightness being selected in dependence on the maximum approach to the light-emitting element. If the hand is moved farther away again in the meantime, the brightness is no longer increased. With a further approach, the brightness is lowered again so that when the distance S is undershot, the brightness is reduced completely to 0.

An identical procedure can also be performed with the light-emitting element switched off with brightness 0, the brightness being increased linearly as soon as the hand approaches closer than P but farther than S, the brightness being increased to 100% when the distance drops below the distance S.

LIST OF REFERENCE DESIGNATIONS

1 Lighting device
2 Cover strip
3 Housing
4 Lighting device
5 Lighting device
6 Light-emitting element
7 Light-emitting element
8 Light-emitting element
9 Light-emitting element
10 Light-emitting element
11 Cover strip
12 Control unit
13 Detection unit
14 Interpretation unit
15 Drive unit
20 Hand
21 Operating web
22 Detection antenna

The invention claimed is:

1. A method for operating a lighting device, the method comprising
providing a lighting device configured to illuminate a passenger compartment of a motor vehicle comprising a first number of light-emitting elements, a second number of control elements for switching the light-emitting elements on or off and for controlling the brightness of the light-emitting elements, and a microcontroller comprising a detection unit, an interpretation unit, and a drive unit, wherein the second number of control elements is equal to the first number of light-emitting elements, wherein each light-emitting element of the first number light-emitting elements is paired with only one control element of the second number of control elements, wherein each of the control elements is directly adjacent to a corresponding light emitting element;

moving of at least one hand of a user over two or more control elements, receiving at the detection unit a signal from the control elements, processing the signal at the interpretation unit to identify human hand gestures and generate drive commands, and driving the illumination of the light-emitting elements with the drive unit utilizing the drive commands, wherein (i) with a fast movement of the hand from a first light-emitting element over an adjacent second light-emitting element to a further adjacent third light-emitting element, the first light-emitting element darkens or is extinguished and the second light-emitting element brightens or lights up and subsequently the second light-emitting element darkens or is extinguished and the third light-emitting element brightens or lights up, wherein the fast movement is a movement of about 10 to 20 cm within 0.5 seconds, and (ii) with a regular movement of the hand from a first light-emitting element over an adjacent second light-emitting element to a further adjacent third light-emitting element, the first light-emitting element remains in its current state and the second light-emitting element brightens or lights up, and subsequently the third-light emitting element lights up, wherein the regular movement is a movement slower than the fast movement.

2. The method according to claim 1, wherein, starting from the first light-emitting element in the direction of movement of the hand, N light-emitting elements are provided, the third light-emitting element darkens or is extinguished and the subsequent light-emitting element brightens or lights up, this process being repeated until the (N−1)th light-emitting element darkens or is extinguished and the Nth light-emitting element brightens or lights up.

3. The method according to claim 1, wherein with a movement of two hands in opposite directions along the control elements or the light-emitting elements with associated control elements, the light-emitting elements are all switched on or off or increase or decrease in their brightness so that they brighten up or light up or darken or are extinguished.

4. The method according to claim 3, wherein the movement of two hands in opposite directions is a movement of the hands toward each other or away from each other.

5. The method according to claim 1, wherein when the hand is positioned within a first threshold value of the distance to a first control element of the second number of control elements and the position of the hand is maintained approximately steady, the brightness of the light-emitting elements is driven to become cyclically brighter and thereafter darker again with an increasing period of time until the hand is no longer positioned within the first threshold value.

* * * * *